US011821962B2

(12) United States Patent
Ord et al.

(10) Patent No.: US 11,821,962 B2
(45) Date of Patent: Nov. 21, 2023

(54) METHOD, DEVICE AND ARRANGEMENT FOR MONITORING ALTERNATING CURRENT ELECTRIC APPARATUSES

(71) Applicant: E.ON SE, Essen (DE)

(72) Inventors: Nicholas Ord, Munich (DE); Florian Fecher, Munich (DE); Maria Garbuzova-Schlifter, Munich (DE); Laura Antonia Färber, Munich (DE); Eugenio Scionti, Munich (DE)

(73) Assignee: E.ON SE, Essen (DE)

( * ) Notice: Subject to any disclaimer, the term of this patent is extended or adjusted under 35 U.S.C. 154(b) by 0 days.

(21) Appl. No.: 17/786,381

(22) PCT Filed: Nov. 16, 2020

(86) PCT No.: PCT/EP2020/082246
§ 371 (c)(1),
(2) Date: Jun. 16, 2022

(87) PCT Pub. No.: WO2021/121821
PCT Pub. Date: Jun. 24, 2021

(65) Prior Publication Data
US 2023/0023617 A1    Jan. 26, 2023

(30) Foreign Application Priority Data
Dec. 16, 2019 (EP) .................................... 19216406

(51) Int. Cl.
*G01R 31/62* (2020.01)
*G01R 29/08* (2006.01)
(52) U.S. Cl.
CPC ......... *G01R 31/62* (2020.01); *G01R 29/0814* (2013.01)

(58) Field of Classification Search
CPC ................ G01R 31/62; G01R 29/0814; G01R 31/1263; G01R 31/1209; G01R 31/1218; G01R 31/12
(Continued)

(56) References Cited
U.S. PATENT DOCUMENTS 5,903,158 A * 5/1999 Eriksson ............ G01R 31/1227
324/536
6,114,871 A * 9/2000 Shiota .................. G01R 31/343
324/765.01
(Continued)

FOREIGN PATENT DOCUMENTS

| CN | 106771895 A | 5/2017 |
| EP | 0181775 A1 | 5/1986 |
| KR | 101992385 B1 | 4/2019 |

OTHER PUBLICATIONS

Translation of CN 106771895 (Year: 2017).*

*Primary Examiner* — Christopher P McAndrew
(74) *Attorney, Agent, or Firm* — Thorpe North & Western, LLP.

(57) ABSTRACT

The invention relates to a method, a device (10) and an arrangement (1) for monitoring alternating current electric apparatuses (3), like e.g. power distribution transformers. The inventive method relies on an inductor antenna (11, 11') suitable to detect the electromagnetic field at the frequency of the alternating current the apparatus (3) to be monitored is supplied with arranged in the vicinity of but distant to the apparatus (3) to be monitored and comprises the steps: —Detecting the electromagnetic field radiated by the electric apparatus (3) to be monitored; —Digitizing the detected electromagnetic field to obtain EMF-data; —Running a Fast-Fourier-Transformation on the digitized EMF-data to obtain FFT-transformed data; and —Monitoring the magnitudes of the FFT-transformed data at least at the (Continued)

Figure 1:
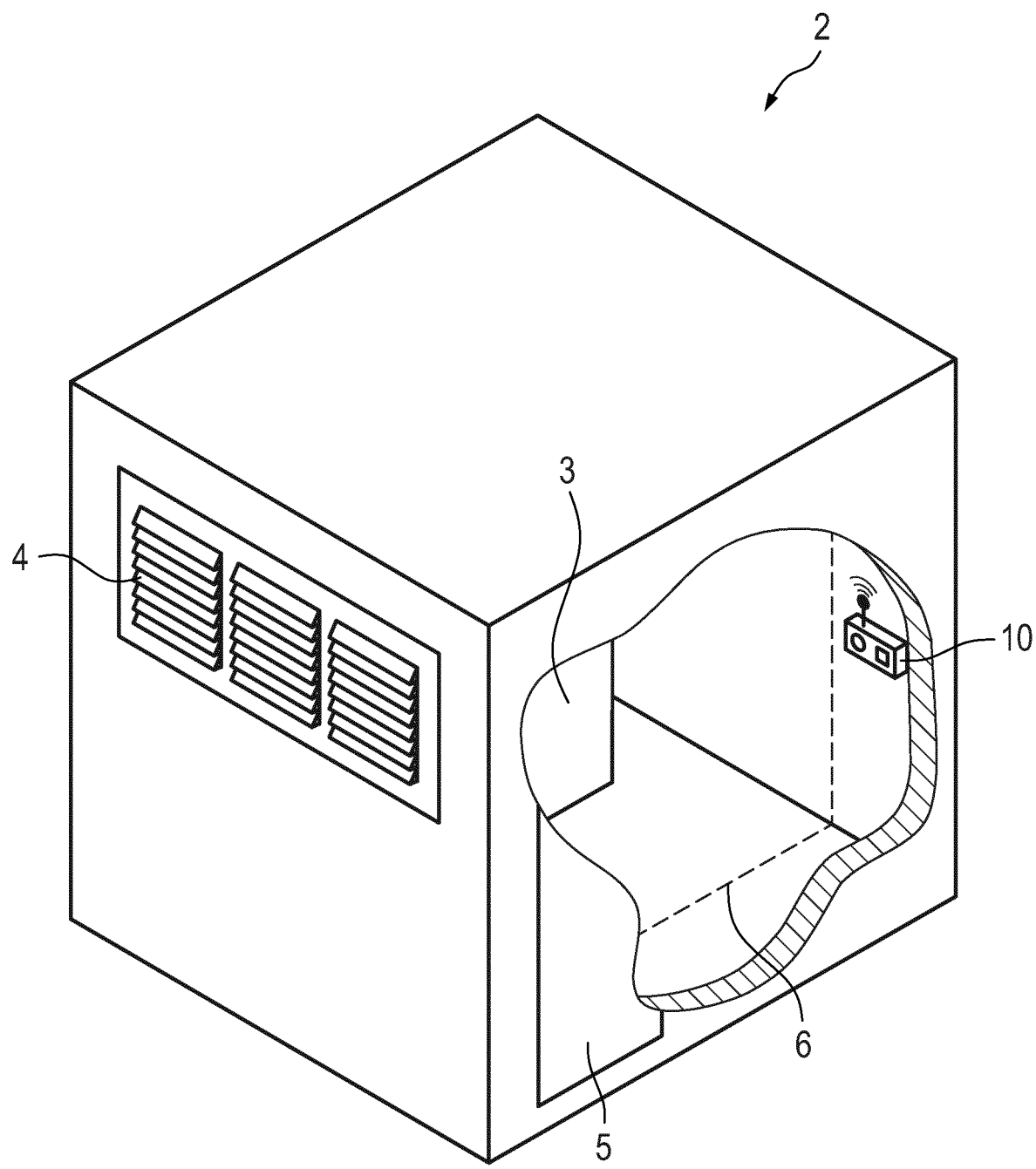

frequency of the alternating current the apparatus (3) to be monitored is supplied with and its third harmonic for anomalies. The inventive device (10) and arrangement (1) are configured to perform the inventive method.

17 Claims, 4 Drawing Sheets

(58) Field of Classification Search
USPC .......................................................... 324/547
See application file for complete search history.

(56) References Cited

U.S. PATENT DOCUMENTS

| | | | |
|---|---|---|---|
| 6,297,642 B1 | 10/2001 | Shibahara et al. | |
| 2003/0189431 A1* | 10/2003 | Perkins | G01R 31/62 324/509 |
| 2006/0235633 A1 | 10/2006 | Simons et al. | |
| 2008/0027663 A1* | 1/2008 | Anderson | G01R 31/1227 340/657 |
| 2014/0292350 A1* | 10/2014 | Yoshioka | F01N 9/00 324/551 |
| 2015/0026291 A1 | 1/2015 | Sahdev | |
| 2015/0091598 A1 | 4/2015 | Han et al. | |
| 2016/0041219 A1* | 2/2016 | Werelius | G01R 31/1227 702/57 |
| 2016/0169958 A1* | 6/2016 | Ohtsuka | G01R 31/1263 324/501 |
| 2018/0315546 A1* | 11/2018 | Cheim | G01D 5/35316 |

\* cited by examiner

METHOD, DEVICE AND ARRANGEMENT FOR MONITORING ALTERNATING CURRENT ELECTRIC APPARATUSES

The invention relates to a method, a device and an arrangement for monitoring alternating current electric apparatuses, like e.g. power distribution transformers.

In an electric power distribution network ("power grid") various apparatuses are used for distributing the electric power in accordance with the demand, while maintaining the power grid's nominal values, e.g. the rated voltage or the rated frequency. In order to transfer electrical power from one voltage level to another within a power grid (e.g. from high-voltage transmission sub-grids to local low or medium voltage distribution sub-grids), transformers are used. In typical sized power grids, several thousand transformers are installed throughout the grid.

Since the proper functioning of the transformers are vital for the operation of the power grid, the transformers need to be inspected regularly for indications of imminent defects. An e.g. monthly inspection of all transformers in a power grid requires vast amounts of resources, mainly working hours of technicians.

In addition, in case of an actual failure of one or more transformers, it is often not possible to identify the specific malfunctioning transformer(s). Rather, only the general area of the grid, where the fault has occurred, can be determined. Thus, in order to find the malfunctioning transformer(s), technicians are sent out to manually check each transformer within said area for proper functioning. The number of transformers requiring manual inspections in this case can typically amount to 30 transformers.

In order to reduce the requirement for manual inspection, monitoring devices have been developed that are directly integrated into the transformer, which may monitor currents, loads, load factors, oil temperature etc. Since these monitoring devices are directly integrated into the transformer to be monitored, they need to be designed to withstand the electromagnetic and thermal exposure within a transformer, which makes them costly. Furthermore, the installation of such monitoring devices can only be done by specially trained technicians and generally requires the transformer to be switched off during the installation causing interruptions to the grid.

As a result, it is often not viable to install monitoring devices according to the state of the art in all transformers of a grid.

It is an object of the present invention to provide a method, a device and an arrangement for monitoring alternating current electric apparatuses like transformers, which at least in part counter the disadvantages of the current state of the art.

This problem is solved by a method according to the main claim as well as a device and an arrangement according to the independent claims. Preferred embodiments are the subject matter of the dependent claims.

The invention thus relates to a method for monitoring an alternating current electric apparatus with an inductor antenna suitable to detect the electromagnetic field at the frequency of the alternating current the apparatus to be monitored is supplied with arranged in the vicinity of but distant to the apparatus to be monitored, comprising the steps:
Detecting the electromagnetic field radiated by the electric apparatus to be monitored;
Digitizing the detected electromagnetic field to obtain EMF-data;
Running a Fast-Fourier-Transformation on the digitized EMF-data to obtain FFT-transformed data; and
Monitoring the magnitudes of the FFT-transformed data at least at the frequency of the alternating current the apparatus to be monitored is supplied with and its third harmonic for anomalies.

The invention further relates to a monitoring device to be used in monitoring an alternating current electric apparatus in accordance with the inventive method, to be arranged in the vicinity of but distant to the apparatus to be monitored comprising
an inductor antenna suitable to detect radiated electromagnetic waves at the frequency of the alternating current the apparatus to be monitored is supplied with;
a digitizer to digitize the radiated electromagnetic waves detected by the inductor antenna into EMF-data;
a processor to perform a Fast-Fourier-Transformation on the EMF-data resulting in FFT-transformed data; and
a communication module to transmit at least part of the FFT-transformed data to a central evaluation unit for monitoring the magnitudes of the FFT-transformed data at least at the frequency of the alternating current the apparatus to be monitored is supplied with and its third harmonic for anomalies.

In addition, the invention also relates to an arrangement for monitoring an alternating current electric apparatus in accordance with the inventive method, with a monitoring device to be arranged in the vicinity of but distant to the apparatus to be monitored and a central evaluation unit, wherein the monitoring device comprises
an inductor antenna suitable to detect radiated electromagnetic waves at the frequency of the alternating current the apparatus to be monitored is supplied with;
a digitizer to digitale the radiated electromagnetic waves detected by the inductor antenna into EMF-data;
a communication module to transmit the EMF-data to the central evaluation unit;
and wherein the central evaluation unit is configured to
run a Fast-Fourier-Transformation on the digitized EMF-data to obtain FFT-transformed data; and
monitor the magnitudes of the FFT-transformed data at least at the frequency of the alternating current the apparatus to be monitored is supplied with and the third harmonic for anomalies.

The invention is based on the insight that by monitoring the electromagnetic field of an alternating current electric apparatus in the frequency domain with specific focus on at least the frequency of the alternating current and its third harmonic (i.e. three times the frequency of the alternating current), anomalies in the operation can be determined that can provide sufficiently reliable indications for nearing or acute faults of the monitored apparatus. It has been found that while the oscillation of the electromagnetic field at the frequency of the alternating current is directly correlated to the current and/or electric power going through the monitored apparatus (depending on the type of apparatus), by concurrently monitoring the magnitudes of the frequency domain at the third harmonic detecting, various divergences e.g. in the correlations between the frequency components at said two frequencies may be observed, which have been established to provide good indicators for nearing or acute faults.

For this, the electromagnetic field radiated by the monitored apparatus is detected with the help of inductor antenna, which, of course, needs to be suitable to detect the electromagnetic field at the frequencies later used for the monitoring. Thus the inductor antenna needs to be suitable to detect the electromagnetic field at the frequency of the alternating current the apparatus to be monitored is supplied with. Such antennae are in general at the same time suitable for detecting the electromagnetic field at the third harmonic.

The inductor antenna as such provides an analog signal, which is then digitized for further processing. Said digitizing needs to be done with a suitable sample frequency which can easily and with little effort be determined by a skilled person for any use case of the present invention conceivable, and results in digital EMF-data.

Said digital EMF-data can then be fed into a Fast-Fourier-Transformation, which converts the EMF-Data from its time domain to FFT-transformed data in the frequency domain. From the FFT-transformed data, the magnitudes at the required frequencies can easily be extracted and used for monitoring as described above.

Of course, any number of harmonics and various correlations between those may be monitored in order determine signs of potential failure of the monitored apparatus, wherein it is even feasible that specific divergences in specific magnitude or correlations might point towards a specific type of failure. In the invention, it can, however, generally be sufficient for monitoring the magnitudes to rely on a single correlation between the magnitudes at different frequencies, even not looking at the actual magnitudes at said frequencies. It this case the monitoring of magnitudes consists (only) of a monitoring of correlations or even a single correlation between the frequency magnitudes at the frequency of the alternating current the apparatus to be monitored is supplied with and its third harmonic. With this correlation alone, typically a wide array of potential faults of the monitored apparatus can be identified.

Monitoring the magnitudes of the FFT-transformed data and especially the determination of abnormal changes in magnitudes and/or divergences in a specified correlation may generally comprise a comparison with historic data of the electromagnetic field detected for the monitored apparatus in the past, i.e. previously collected with the inventive method. Any divergence found between said historic data and the momentary measurements can be interpreted in changes to the apparatus' operation, which in turn might point towards potential failure or malfunctioning of the apparatus. Relying on historic data provides the advantage of the inductor antenna and/or its positioning not needing to be specifically calibrated. Rather, as long as the inductor antenna is suitably arranged to detect the apparatus' electromagnetic field, the calibration is done automatically in an initial phase of an assumed proper operation of the apparatus.

The detection of the electromagnetic field may be supplemented by taking other concurrent measurements, which might also provide information about the monitored apparatus' operation and health, either on their own account or in correlation to other measurements and values, e.g. the magnitudes in the frequency domain explained above. For this in particular, it is preferred that any other concurrent measurements are recorded in temporal correlation with the FFT-transformed data, in order to allow easy determination of anomalies in magnitudes of and/or correlation between the various data.

Said other measurement might comprise the temperature of the or at least in the vicinity of the monitored apparatus. In addition or alternatively, the temperature distribution on the elective apparatus to be monitored might be captured. While for the former measurements e.g. an infrared thermometer is sufficient, the latter measurement requires a thermal imaging sensor. With these measurements temperature rises in the monitored apparatus can be detected, which—at least in correlation with the information of the FFT-transformed data—might be assessed to determine unusual behaviour.

Alternatively or in addition, gas emitted by or in the vicinity of the electric apparatus may be monitored. By monitoring gas emissions or the general composition of gas, e.g. the air surrounding the monitored apparatus, leakage of coolant or boiling of oil can be determined.

The sound emitted by the apparatus to be monitored or in its vicinity might also be detected and evaluated. Some (approaching) failures of an apparatus might produce noise.

Same is true for light emitted by or in the vicinity of the apparatus to be monitored, e.g. a flash of light resulting from sparking, which might also be a signal for a failure.

Similarly, the seismic micro vibrations caused by the monitored apparatus or appearing in its vicinity may be detected. These vibrations may generally correlate with the noises of a monitored apparatus but may also indicate electromechanical faults in the apparatus. For example, with a transformer, increased seismic micro vibration may point towards a fault in the pump system for its cooling or a general overload in the transformer, where it will vibrate substantially more than previously, which both may be pre-cursors to failure.

All of the above potential additional measurement and the detection of the electromagnetic field have in common that the respective inductor antenna and/or sensors (e.g. temperature sensor, gas sensor, sound sensor, light sensor, . . . ) are arranged in the vicinity of, but distant to the apparatus to be monitored. In other words, the inductor antenna and/or sensors do not need to be mounted in or directly on the apparatus to be monitored; it is rather sufficient for them to be arranged in the vicinity next to the monitored apparatus. Since the monitored apparatus does not need to be altered for the inductor antenna and/or sensor(s) required for the inventive method, their installation can be done independent from the apparatus, thus not requiring to be done by a technician skilled in working on the apparatus to be monitored.

In fact, the invention generally allows the inductor antenna and/or any sensor to take a measurement according to the above is positioned at a distance from the apparatus to be monitored greater than the electrical safety distance of said apparatus. Various apparatuses, especially ones use in power distribution, generate such a strong electromagnetic field when running that requires people to keep a distance from the apparatus to be safe. Any work to be done within said distance to an apparatus required the apparatus to be shut off. Since the inventive method allows the inductor antenna and/or any other sensor used for the method to be arranged outside this electrical safety distance, these and all other components potentially utilized to carry out the invention to monitor a certain apparatus can be installed with the apparatus staying in full operation. A down time of the apparatus for installation is not required.

It is generally preferred that the monitoring in accordance with the present invention is done in real-time or at least in near real-time, i.e. real-time monitoring only delayed by data processing and/or data transmission, especially packet based data transmission. Since the inventive method can help to identify approaching failures of an apparatus, real-time monitoring can help prevent the actual outage of the apparatus by initiating appropriate counter-measures.

For identifying (approaching) failures, a sampling rate for the EMF-data above 5.000 samples per second is often appropriate and thus preferred. In order to make said identification more accurate, the sampling rate may preferably be above 10.000 samples per second, even more preferably above 18.000 samples per second. In certain applications, a lower sampling rate might also be sufficient, for example 200 samples per second.

Preferably, the frequencies the FFT-transformed data is monitored at comprise the frequencies or frequency ranges 50±3 Hz and 150±3 Hz and/or 60±3 Hz and 180±3 Hz, which is equivalent to the common grid frequencies and their respective third harmonic in e.g. Europe and the USA. With the indicated ranges, slight frequency deviations can also be accounted for.

If any anomalies are detected, the inventive method might result in a warning to one or more technicians that may decide on any further course of action. Alternatively or in addition, the detection of an anomaly might result in an automatic change of controlling the monitored apparatus or the arrangement it is in, e.g. a power grid.

The inventive method is particularly well suited to monitor apparatuses used in power distribution. These apparatuses that often radiate a strong electromagnetic field that can easily be detected by an inductor antenna. At the same time, shutting down these apparatuses for installation e.g. monitoring devices according to the prior art, is often problematic or at least delicate when trying to avoid a shutdown of at least part of the power distribution grid. It has been established that the inventive method is particularly advantageous for monitoring power distribution transformers, which thus is the preferred use case.

The monitoring device according to the present invention is configured to be used in the inventive method and thus comprises the hardware elements for detecting the electromagnetic waves radiated by an apparatus to be monitored and digitizing said detections into EMF-data, i.e. a suitable inductor antenna and a digitizer.

The device also comprises a processor to perform the Fast-Fourier-Transformation on the EMF-data locally so that the data to be sent to a central evaluation unit for the actual monitoring, e.g. by comparison with historic data, via the communication module is reduce in comparison to sending the full EMF-data. The data volume can be further reduced if only the FFT-transformed data of those frequencies required by the central evaluation unit is forwarded by the communication module; the FFT-transformed data of any other frequency may be discarded.

The inventive arrangement, however, follows a slightly different approach. It comprises a monitoring device generally similar to the inventive monitoring device described above, but without the processor to perform the Fast-Fourier-Transformation on the obtained EMF-data locally. Instead, the raw digitized EMF-data as such is transmitted to the central evaluation unit, which is also part of the arrangement, via the communication module. The Fast-Fourier-Transformation is then run on the central evaluation unit, which uses the resulting FFT-transformed data for the monitoring as described above.

In both, the inventive device and the inventive arrangement, the monitoring device preferably comprises one or more additional sensors, whose measurements are taken from a distance to the monitored apparatus and are also transmitted to the central evaluation unit for monitoring purposes. These sensor(s) may be selected from the group comprising:

non-contact temperature sensor and/or thermal imaging sensor for measuring the temperature of and/or the temperature distribution on a monitored apparatus from a distance;

a gas sensor for detecting gas emitted by or in the vicinity of a monitored apparatus;

a sound sensor for detecting sound emitted by a monitored apparatus or in its vicinity;

a light sensor for detecting light emissions by or in the vicinity of a monitored apparatus; and a vibration sensor for detecting seismic micro vibrations caused by the monitored apparatus.

It has been found that even though all sensors are to be positioned distanced from the apparatus to be monitored, e.g. outside of the electrical safety distance of an apparatus, gas, sound and light measurements can often be allocated to the monitored apparatus, either because the apparatus is positioned in an otherwise confined space or by means of correlation with other data stemming from the apparatus, especially the FFT-transformed data.

The inventive device and inventive method are generally configured to be used in the inventive method. Subsequently, they are preferably configured to also allow the preferred embodiments of the inventive method to be performed.

The communication module may be configured to transmit and/or receive data arbitrarily via the internet by utilizing a wireless or wired network (e.g. a WLAN-Network according to the IEEE-802.11-Standard, a mobile communication network such as 3G, LTE, 4G or 5G or powerline communication). Alternatively, separate data communication networks might be used, possibly in accordance with the IEEE-802.15.4 thread standard.

Figure 2:
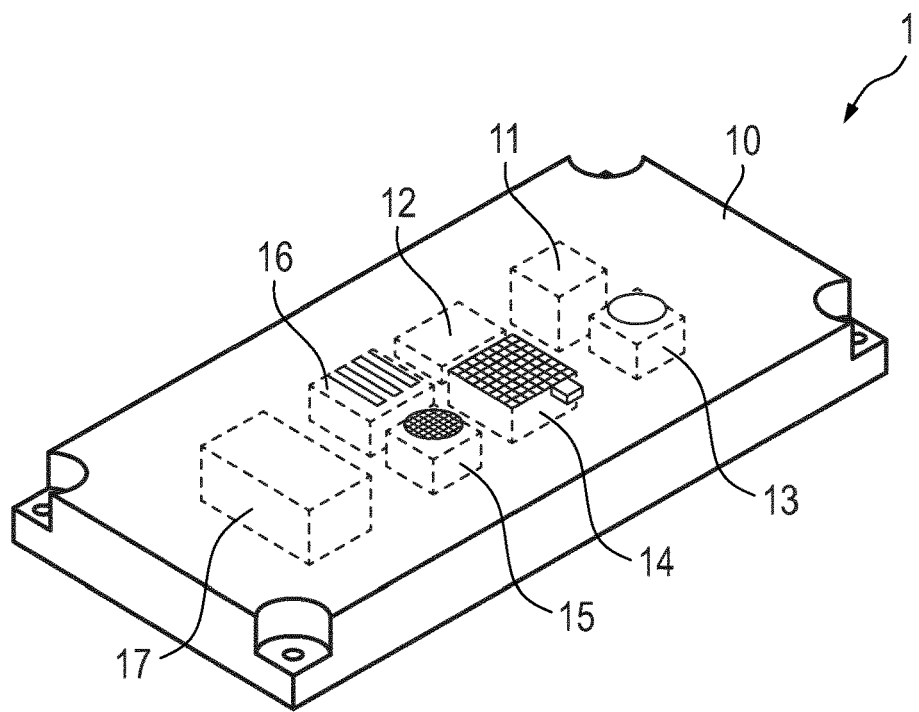
Figure 2:
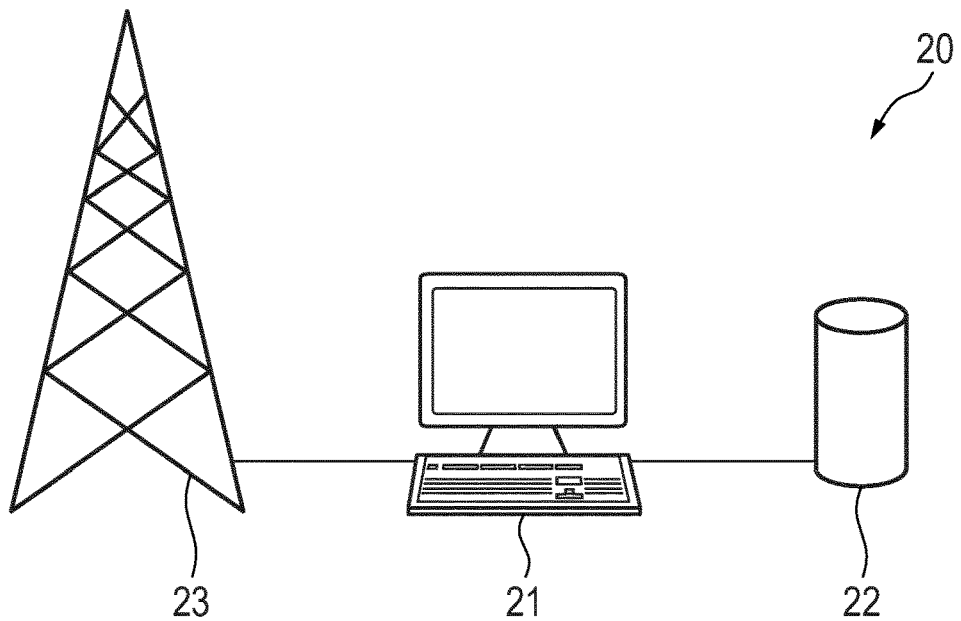
Figure 3:
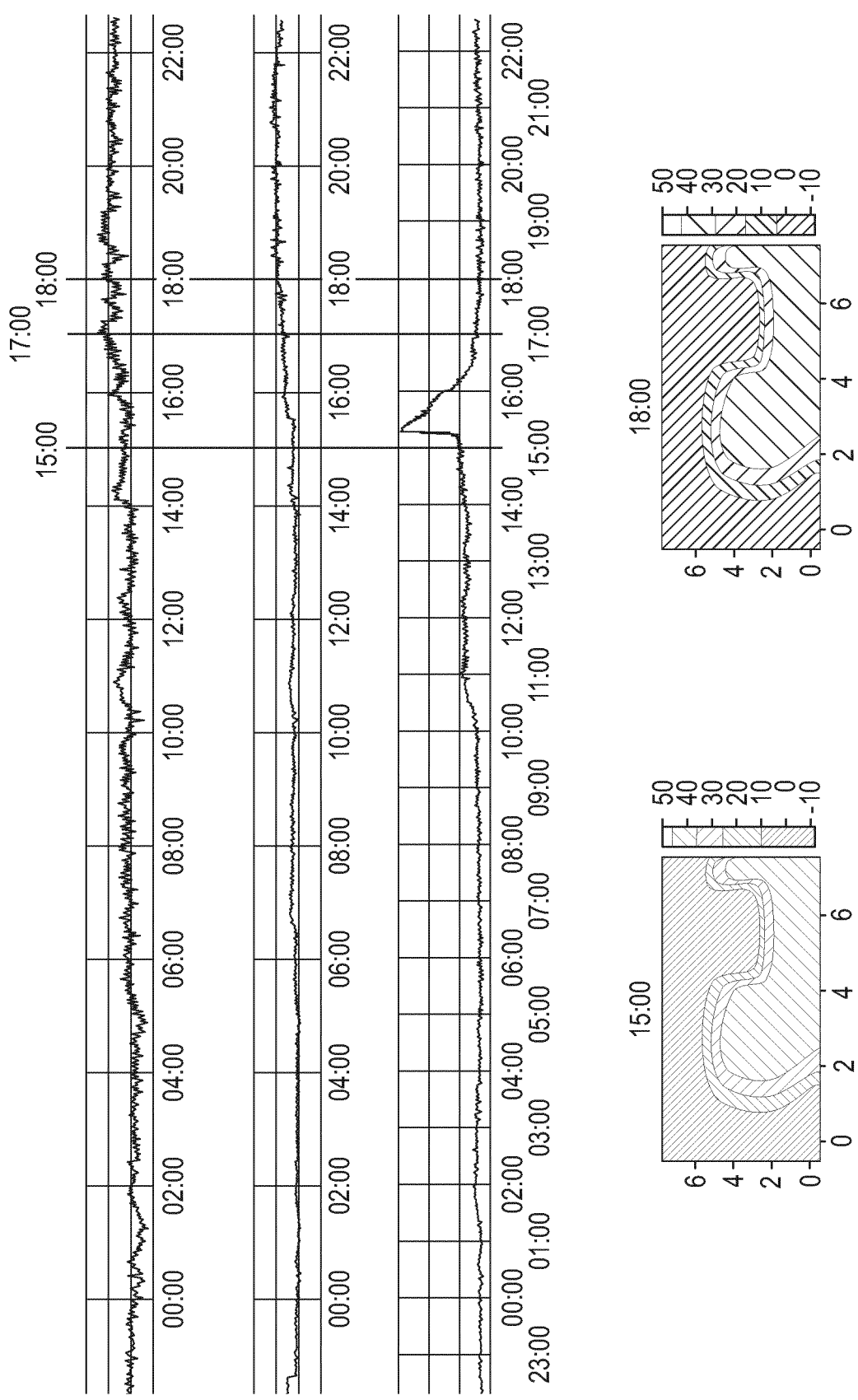
Figure 4:
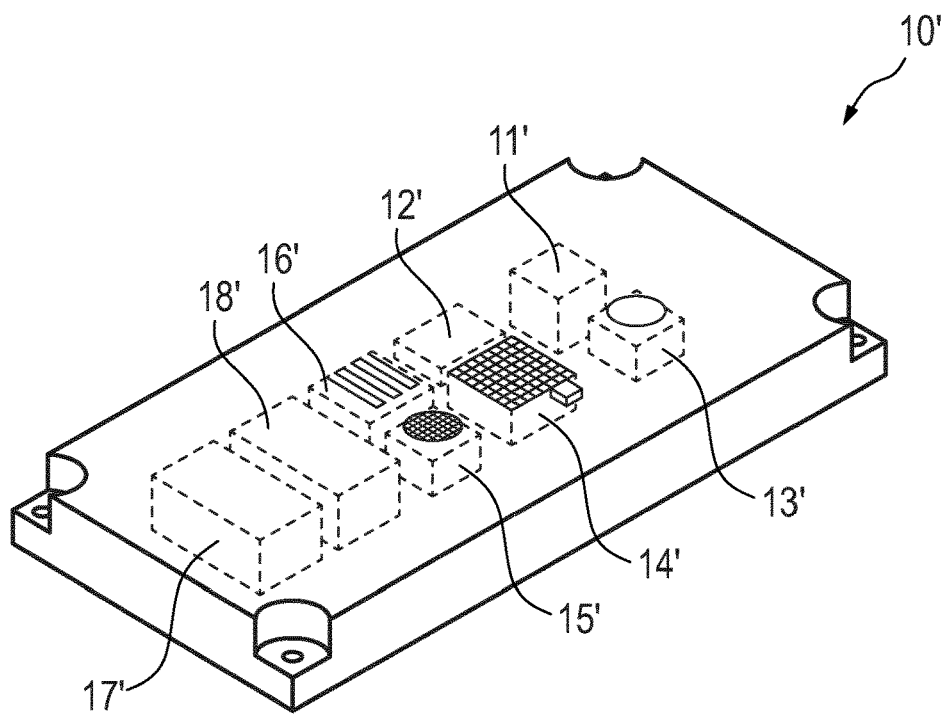
Figure 4:
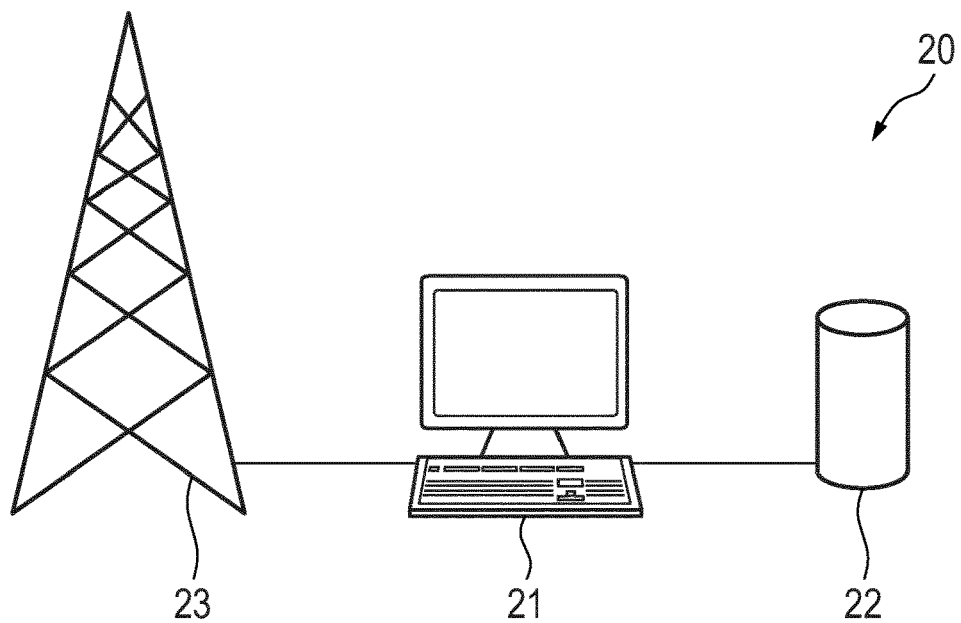

The invention will now be described in further detail in regard to the enclosed figure:

FIG. 1: a schematic drawing of a transformer hut with a monitoring device of an inventive arrangement to perform the inventive method;

FIG. 2: a schematic illustration of the inventive arrangement according to FIG. 1;

FIG. 3: exemplary data obtained by the inventive arrangement according to FIGS. 1 and 2 when performing the inventive method; and FIG. 4: a schematic illustration of an inventive device.

FIG. 1 schematically depicts a transformer hut 2 with a transformer 3 inside. The transformer 3 is fully encased in the transformer hut 2, which has ventilation outlets 4 and a door 5 to be able to access the transformer 3 if need be. The transformer hut 2 is provided with electromagnetic shielding according to the prior art if necessary.

When operating, the transformer 3 radiates an electromagnetic field, which is as powerful close to the transformer 3 to be hazardous to health. Within the transformer hut 2, there is thus a marking 6 on the floor and walls which indicates the electrical safety distance, i.e. the distance that should be kept at all times the transformer 3 is operating.

On one of the inner walls of the transformer hut 2, outside the electrical safety distance, a monitoring device 10 is mounted. Since the monitoring device 10 is positioned within a confined space around the transformer 3, the measurements taken by the monitoring device 1 can be related to the transformer 3 despite the distance to the monitoring device 10. The monitoring device 10 forms part of an inventive arrangement 1 to perform the inventive method and will now be described in more detail with reference to FIG. 2.

The monitoring device 10 of the arrangement 1 as shown in FIG. 2 comprises an inductor antenna 11 suitable to detect radiated electromagnetic waves by the transformer 2, especially at the frequency of the alternating current the transformer 2 is fed and the third harmonic thereof. In the present example, the transformer 2 is connected to a power grid with a nominal frequency of 50 Hz. Thus, the nominal frequency of the third harmonic is 150° Hz.

The inductor antenna 11 is connected to a digitizer 12 (connection not shown), which will digitize the analog signal of the inductor antenna 11 into digital EMF-Data by the digitizer 12. The EMF-Data is then transferred to the communication module 17, which transmits the EMF-data to the central evaluation unit 20 to be described later.

In addition to the inductor antenna 11, the monitoring device 10 thermal imaging sensor 14 for measuring the temperature distribution on an object in the sensor's 14 field of vision. It is readily apparent that the monitoring device 10 shall be positioned such that the apparatus to be monitored is within said field of vision. The thermal imaging sensor 14 is accompanied by an ambient temperature sensor 13 in order to calibrate the thermal imaging sensor 14 to deliver absolute temperature values.

Furthermore, a gas sensor 15 is provided. For example, in the case depicted in FIG. 1, where the monitoring device 10 is mounted within a transformer hut 2, sudden and significant changes in the composition of the air within the hut 2 may be related to gas emissions from the transformer 3.

Similarly, sounds recorded by the sound sensor 16 also provided on the monitoring device 10 may—at least above a certain volume—be related to the transformer 3 as the only potentially sound producing component within the transformer hut 2 in the example provided.

Alternatively or in addition to the sound sensor 16, the monitoring device 10 may comprise a vibration sensor to detect the seismic micro vibrations caused by the transformer 3 and its subsystems. The vibrations of the transformer 3 propagate through the floor and the walls to the monitoring device 1 and can be measures. Anomalies in the vibration, i.e. deviation from normal vibration patterns that have emerged over time, can be pre-cursors to faults.

The measurements and other data obtained by the sensors 14, 15, 16 is transferred to the communication module 17 and transmitted to the central evaluation unit 20. All data from the sensors 14, 15, 16 is timestamped, e.g. by the communication module 17, in order to be put in temporal relation with the EMF-data which is also timestamped. The communication module 17 is configured to establish a connection to the internet via a mobile communication network and to send the data via internet.

As already mentioned, apart from the monitoring device 10 the inventive arrangement 1 also comprises a central evaluation unit 20, which further processes the data received from the monitoring device 10 shown in FIG. 2, but also any other number of comparable monitoring devices 10, 10' according to FIG. 2 or 4 each used for monitoring another transformers 2 or any other apparatus radiating an electromagnetic field detectable by the respective monitoring device 10.

The central evaluation unit 20 comprises a receiving unit 23 for receiving the data sent by the communication modules 17 of the various monitoring devices 10, 10'. Independent from it being depicted as a radio pole, the receiving unit 23 is solely required to be connected to the internet (either wireless or wired) in order for it to receive the required data.

The data received is then processed in the processor unit 21.

First, the EMF-data received from the monitoring device 10 of FIG. 2, which describes the frequency of the measured electromagnetic field in a time domain, is transferred to a frequency domain by running a Fast-Fourier-Transformation on the digitized EMF-data to obtain FFT-transformed data.

Then the FFT-transformed data as well as any other data of additional sensors 14, 15, 16 received from the monitoring device 10 are monitored for anomalies. The underlying "normal conditions" required to actually detect anomalies is based on historic data that has been previously received from the respective monitoring device 10 stored in the data storage 22.

The monitoring can be limited in detecting deviations in the magnitudes of individual values, e.g. of the FFT-transformed data at a specific frequency or of any value provided by one of the additional sensors 14, 15, 16. However, it is also possible to define correlations between two or more values and monitor whether there is any deviation from the normal conditions. Said correlations might either be manually defined or they are determined by e.g. training a suitable neuronal network.

If any anomaly is detected, a warning may be produced by the central evaluation unit 10 that might be used to send a technician to the site of the monitored apparatus to verify any malfunctioning and/or to perform maintenance. Often, the type of anomaly detected already provides an indication, what might be wrong with the monitored device.

This might be illustrated by the example shown in FIG. 3. In the upper part, this figure shows timelines of values monitored by the monitoring device 10 providing the underlying data, while in the bottom part, two thermal images at distinct points in time are reproduced. The timelines each represent approx. 24 hours of data received for the transformer 3 of FIG. 1 by a monitoring arrangement 1 such as shown in FIG. 2.

In the present example, it is assumed that the transformer 3 is run at a constant load over the depicted period. However, shortly after 15:00 there is a sudden and brief emission of gaseous coolant from the transformer 3.

In FIG. 3, the top timeline represents the frequency magnitude at a frequency of 50 Hz, i.e. the nominal frequency of the power grid the transformer 3 is connected to. The timeline below is the frequency magnitude at a frequency of 150 Hz, i.e. the third harmonic to the nominal frequency.

Just looking at these two timelines, shortly after the gas emission incident, it may be noted that the frequency magnitude at 50 Hz increases until about 17:00 before it stays at the higher level reached. At the same time, the frequency magnitude at 150 Hz increases as well. However, the increase at this frequency lasts until about 18:00.

Due to the uneven development of these two magnitudes, which are usually directly proportionate as can already be surmised from the historic data as exemplary shown for the time period 00:00 to 15:00, the central evaluation unit 20 might already detect an anomaly and issue a warning for the specific transformer 3.

Of course, the accuracy in determining anomalies can be increased by taking the data of additional sensors 14, 15, 16 provided by the monitoring device 10 into account.

The third timeline in FIG. 4 shows the output of the gas sensor 15, which represents the share of total volatile organic compounds (TVOC) in the air within the transformer hut 2. The emission of gaseous coolant from the transformer shortly after 15:00 is readily apparent. This additional information might be used to better assess the changes in the frequency magnitudes as explained above. For example, by correlating the data from all three timelines, it might be possible to estimate whether the amount of coolant lost in the gas emission is critical and required immediate attention or whether maintaining the transformer 3 can be delayed till a qualified technician is available for maintaining the transformer 3.

For the assessment, it might in addition be relied on the images from the thermal imaging sensor 14, two of which are reproduced in FIG. 3. The left reproduction shows the temperature distribution over the transformer at 15:00, i.e. before the gas emission, while the right reproduction shows the temperature distribution at 18:00. Due to the calibration of the thermal imaging sensor 14 via the ambient temperature sensor 13, a comparison of the two images reveals an overall increase in temperature of the transformer 3. At the same time, however, it can be noted that the temperature at 18:00 is still similarly distributed as at 15:00. Since there is no temperature hotspot, i.e. very high temperatures in distinct areas, the urgency for maintenance of the transformer 3 might be slightly lower than in case a hotspot is detected.

On a side note and subject to further investigation, the increase in TVOC observed shortly after 10:00 which no noticeable changes in frequency magnitudes might potentially also be recognized as an indication for an approaching malfunctioning of the transformer 3.

In FIG. 4, a monitoring device 10' according to the invention is depicted. This monitoring device 10' largely corresponds to the device 10 of the inventive monitoring arrangement 1 described in connection with FIG. 2, which may also be gathered from the generally identical reference numbers. It is thus referred to the above for the general description of the various components 11' to 17' of the monitoring device 10'.

In addition to the already described inductor antenna 11' with the digitizer 12' connected thereto, there is a processor 18' to perform a Fast-Fourier-Transformation on the EMF-data provided by the digitizer 12' within the monitoring device 10' resulting in FFT-transformed data. The FFT-transformed data—at least the part representing the frequencies to be monitored for anomalies—is then transmitted by the communication module 17' along with any other data provided by the other sensors 13' to 16' to the central evaluation unit 20.

The central evaluation unit 20 is configured to monitoring the magnitudes of the FFT-transformed data as described above, e.g. in context of FIG. 3, and is thus generally comparable, if not identical to the central evaluation unit 20 of FIG. 2 in monitoring the various information received for anomalies. Of course, for the data received from the monitoring device 10' of FIG. 4, the FFT-transformation is not required by the central evaluation unit 20, since this transformation has already been done by the monitoring device 10'.

The invention claimed is:

1. A method for monitoring an alternating current electric apparatus with an inductor antenna suitable to detect the electromagnetic field at the frequency of the alternating current the apparatus to be monitored is supplied with arranged in the vicinity of but distant to the apparatus to be monitored, comprising the steps:
   detecting the electromagnetic field radiated by the electric apparatus to be monitored;
   digitizing the detected electromagnetic field to obtain EMF-data;
   running a Fast-Fourier-Transformation on the digitized EMF-data to obtain FFT-transformed data; and
   monitoring the magnitudes of the FFT-transformed data at least at the frequency of the alternating current the apparatus to be monitored is supplied with and its third harmonic for anomalies;
   wherein concurrently to detecting the electromagnetic field radiated by the electric apparatus to be monitored, at least one of the following measurements are taken from a distance to the electric apparatus to be monitored and are monitored in temporal correlation with the magnitudes of the FFT-transformed data for anomalies, at least:
   temperature of or temperature distribution on the electric apparatus to be monitored;
   gas emitted by or in the vicinity of the electric apparatus to be monitored;
   sound emitted by or in the vicinity of the electric apparatus to be monitored;
   light emitted by or in the vicinity of the electric apparatus to be monitored; or
   seismic micro vibrations caused by the monitored apparatus or appearing in its vicinity may be detected.

2. The method according to claim 1, wherein monitoring the magnitudes of the FFT-transformed data consists of or comprises a monitoring the correlation between the magnitudes at different frequencies.

3. The method according to claim 1, wherein monitoring the magnitudes of the FFT-transformed data or a correlation thereof for anomalies comprises the comparison with historic data of the apparatus to be monitored previously collected by the method.

4. The method according to claim 1, wherein at least the inductor antenna or any sensor to take a measurement is positioned at a distance from the apparatus to be monitored greater than the electrical safety distance of said apparatus.

5. The method according to claim 1, wherein the monitoring is done in real-time or near real-time.

6. The method according to claim 1, wherein the sampling rate for the EMF-data is above 5,000 samples per second.

7. The method according to claim 1, wherein the frequencies the FFT-transformed data is monitored at comprise the frequencies or frequency ranges at least 50±3 Hz and 150±3 Hz or 60±3 Hz and 180±3 Hz.

8. The method according to claim 1, wherein the apparatus to be monitored is a power distribution transformer.

9. A monitoring device to be used in monitoring an alternating current electric apparatus in accordance with the method of claim 1, to be arranged in the vicinity of but distant to the apparatus to be monitored comprising
   an inductor antenna suitable to detect radiated electromagnetic waves at the frequency of the alternating current the apparatus to be monitored is supplied with;
   a digitizer to digitize the radiated electromagnetic waves detected by the inductor antenna into EMF-data;
   a processor to perform a Fast-Fourier-Transformation on the EMF-data resulting in FFT-transformed data; and
   a communication module to transmit at least part of the FFT-transformed data to a central evaluation unit for monitoring the magnitudes of the FFT-transformed data at least at the frequency of the alternating current the apparatus to be monitored is supplied with and its third harmonic for anomalies.

10. An arrangement for monitoring an alternating current electric apparatus in accordance with the method of claim 1, with a monitoring device to be arranged in the vicinity of but distant to the apparatus to be monitored and a central evaluation unit, wherein the monitoring device comprises
   an inductor antenna suitable to detect radiated electromagnetic waves at the frequency of the alternating current the apparatus to be monitored is supplied with;
   a digitizer to digitize the radiated electromagnetic waves detected by the inductor antenna into EMF-data;

a communication module to transmit the EMF-data to the central evaluation unit;

and wherein the central evaluation unit is configured to run a Fast-Fourier-Transformation on the digitized EMF-data to obtain FFT-transformed data; and monitor the magnitudes of the FFT-transformed data at least at the frequency of the alternating current the apparatus to be monitored is supplied with and its third harmonic for anomalies.

11. The monitoring device according to claim 9, wherein the monitoring device further comprises at least one of the following:

non-contact temperature sensor and/or thermal imaging sensor for measuring the temperature of and/or the temperature distribution on a monitored apparatus from a distance;

a gas sensor for detecting gas emitted by or in the vicinity of a monitored apparatus;

a sound sensor for detecting sound emitted by a monitored apparatus or in its vicinity;

a light sensor for detecting light emissions by or in the vicinity of a monitored apparatus; and a vibration sensor for detecting seismic micro vibrations caused by the monitored apparatus.

12. The arrangement according to claim 10, wherein the monitoring device further comprises at least one of the following:

non-contact temperature sensor and/or thermal imaging sensor for measuring the temperature of and/or the temperature distribution on a monitored apparatus from a distance;

a gas sensor for detecting gas emitted by or in the vicinity of a monitored apparatus;

a sound sensor for detecting sound emitted by a monitored apparatus or in its vicinity;

a light sensor for detecting light emissions by or in the vicinity of a monitored apparatus; and a vibration sensor for detecting seismic micro vibrations caused by the monitored apparatus.

13. The method according to claim 6, wherein the sampling rate for the EMF-data is above 10,000 samples per second.

14. The method according to claim 12, wherein the sampling rate for the EMF-data is above 18,000 per second.

15. The method according to claim 1, wherein any number of harmonics and various correlations are monitored to determine signs of potential failure of the monitored apparatus, wherein specific divergences in specific magnitude or correlations point towards a specific type of failure.

16. The method according to claim 3, wherein the magnitudes at said frequencies are disregarded.

17. The method according to claim 3, wherein the monitoring consist of a monitoring of a single correlation between the frequency magnitudes at the frequency of the alternating current, the apparatus to be monitored is supplied with, and its third harmonic.

* * * * *